(12) United States Patent
Tan et al.

(10) Patent No.: US 12,132,448 B2
(45) Date of Patent: Oct. 29, 2024

(54) GALLIUM NITRIDE TRANSIMPEDANCE AMPLIFIER

(71) Applicant: Chang Gung University, Taoyuan (TW)

(72) Inventors: Cher-Ming Tan, Taoyuan (TW); Vimal Kant Pandey, Taoyuan (TW)

(73) Assignee: Chang Gung University, Taoyuan (TW)

( * ) Notice: Subject to any disclaimer, the term of this patent is extended or adjusted under 35 U.S.C. 154(b) by 742 days.

(21) Appl. No.: 17/372,569

(22) Filed: Jul. 12, 2021

(65) Prior Publication Data
US 2022/0140790 A1    May 5, 2022

(30) Foreign Application Priority Data
Nov. 3, 2020  (TW) .................. 109138222

(51) Int. Cl.
| | |
|---|---|
| H03F 1/10 | (2006.01) |
| G01T 1/17 | (2006.01) |
| H01L 29/20 | (2006.01) |
| H03F 3/193 | (2006.01) |

(52) U.S. Cl.
CPC ................ *H03F 1/10* (2013.01); *G01T 1/17* (2013.01); *H01L 29/2003* (2013.01); *H03F 3/193* (2013.01); *H03F 2200/451* (2013.01)

(58) Field of Classification Search
CPC ....... H03F 3/193; H03F 2200/45; G01T 1/17; H01L 29/2003
See application file for complete search history.

(56) References Cited

U.S. PATENT DOCUMENTS

| | | | | |
|---|---|---|---|---|
| 9,755,589 | B2 * | 9/2017 | Oku ...................... | H03G 9/025 |
| 11,177,773 | B1 * | 11/2021 | Nuttgens ................ | H04B 10/69 |
| 2021/0408976 | A1 * | 12/2021 | Lim ...................... | H01L 23/492 |
| 2022/0166909 | A1 * | 5/2022 | Kelly .................... | H04N 23/56 |
| 2022/0263479 | A1 * | 8/2022 | Park ..................... | H03F 3/45179 |

* cited by examiner

*Primary Examiner* — Patricia T Nguyen
(74) *Attorney, Agent, or Firm* — BACON&THOMAS, PLLC

(57) ABSTRACT

The present invention relates to a gallium nitride transimpedance amplifier, as an essential electronic circuit in the proton beam therapy. Because gallium nitride is more tolerant to the secondary radiation generated during the proton beam therapy, it has high reliability and increases the reliability of the overall system.

10 Claims, 6 Drawing Sheets

GALLIUM NITRIDE TRANSIMPEDANCE AMPLIFIER

BACKGROUND OF THE INVENTION

1. Field of the Invention

The present invention relates to a gallium nitride amplifier, particularly a gallium nitride transimpedance amplifier for the prompt gamma detection system used in proton beam therapy.

2. Description of the Prior Art

The proton beam therapy is mainly a type of radiation therapy used for cancer treatment. During cancer/tumor therapy, the proton beam will target the tumor position of patient. Through the Bragg peak phenomenon, the protons carrying energy in a particular depth will release most energy in the tumor (lesion area of cancer), in order to destroy the cancer cells in tumor, and spare the normal cells outside tumor.

From the abovementioned description, it is known that proton beam therapy has a significant advantage over conventional radiotherapy. Compared to the conventional therapy method, the residual dose of proton therapy can be neglected, mainly because most of proton beam energy is deposited in a particular area. However, the secondary neutrons generated during the therapy will influence the reliability and performance of electronic devices in the treatment room.

The conventional prompt gamma detector system uses the silicon devices in the circuit. The detector in the prompt gamma detection system converted the prompt gamma signals into current signal which is converted into voltage by the transimpedance amplifier. Usually, the output voltage gets distorted and requires additional pulse shaping circuit.

In the abovementioned description of electronic circuit uses silicon based devices. It is well known that the performance of silicon based devices in the radiation environment degrades, thus the electronic circuit made up of silicon devices has lower reliability in radiation environment. While the proton beam therapy requires the electronic circuit with better durability and high reliability. Thus to enhance the reliability of the prompt gamma detectors, high reliability electronic devices must be used.

From the abovementioned description, it is known that when the existing electronic circuit uses silicon devices, the requirement on durability and reliability still has a tremendous space to be refined and improved. Thus, further study shall be made to obtain a feasible solution. In other words, the prompt gamma detectors need to use the electronic circuit with better durability and high reliability, which has become a major topic to be concerned in this field.

SUMMARY OF THE INVENTION

The present invention relates to a gallium nitride amplifier for use in the prompt gamma detector used in proton beam therapy. In which, the radiation detection module of the present invention uses the Hamamatsu H8500 photomultiplier to convert the detected gamma ray by the detector into a current pulse. The output current of the H8500 is converted into voltage by the gallium nitride transimpedance amplifier.

As for one of the purposes of the present invention, the bandwidth range of electronic circuit is from 0 MHz to 200 MHz.

As for one of the purposes of the present invention, the total rms noise of the circuit is 64.6 µV in the bandwidth of 0 MHz to 200 MHz.

As for one of the purposes of the present invention, the transimpedance amplifier module comprises a first transistor, a second transistor, a third transistor, a first resistor and a second resistor. The first resistor electrically connects the second resistor and the drain electrode of first transistor. The gate electrode of third transistor electrically connects the source electrode of first transistor and the drain electrode of second transistor. The second resistor electrically connects the gate electrode of first transistor and the drain electrode of third transistor. An input current flows through the source electrode of first transistor.

As for one of the purposes of the present invention, the transimpedance amplifier module further comprises a gain peaking adjustment module, which electrically connects the drain electrode and source electrode of third transistor. The gain peaking adjustment module is a capacitor, which keeps the gain fluctuation of transimpedance amplifier in the range of ±1 dB.

As for one of the purposes of the present invention, the first transistor, the second transistor and the third transistor are gallium nitride high electron mobility transistors.

The present invention can be applied in the electronic circuit field, wherein the current is converted into the voltage for the actual application.

Compared with the silicon devices, the present invention has the advantages of low noise and higher bandwidth.

The present invention can be widely used in the harsh environment, such as vehicles, train, aircraft, oil drilling platform, even in the high radiation environments.

Compared with the silicon based circuit, the circuit design of the present invention is much simpler, which can obtain the same bandwidth with lower noise.

Conventionally, the transimpedance amplifiers are designed using operational amplifier. The present invention uses the non-operational amplifier for the design and manufacturing, so it can widely raise the manufacturing yield and reduce the manufacturing cost.

The present invention relates to a gallium nitride transimpedance amplifier. Because the gallium nitride is more tolerant to the secondary radiation generated during the proton beam therapy, compared to the silicon devices, it has better radiation hardened effect, thus, the present invention can be used as the electronic circuit for prompt gamma detection system. The invention has high reliability and increases the reliability of the overall system.

From the following description, it can further understand the features and advantages of the present invention. Please refer to the attached Figures upon reading.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 illustrates the system block diagram for an embodiment of prompt gamma detection system of the present invention.

DESCRIPTION OF THE PREFERRED EMBODIMENT

In the following description, the attached Figures will be used to describe the implementation of the present invention. In the Figures, the same symbol of element is used to represent the same element. In order to explain clearly, the size or thickness of the element may be exaggerated.

Figure 1:
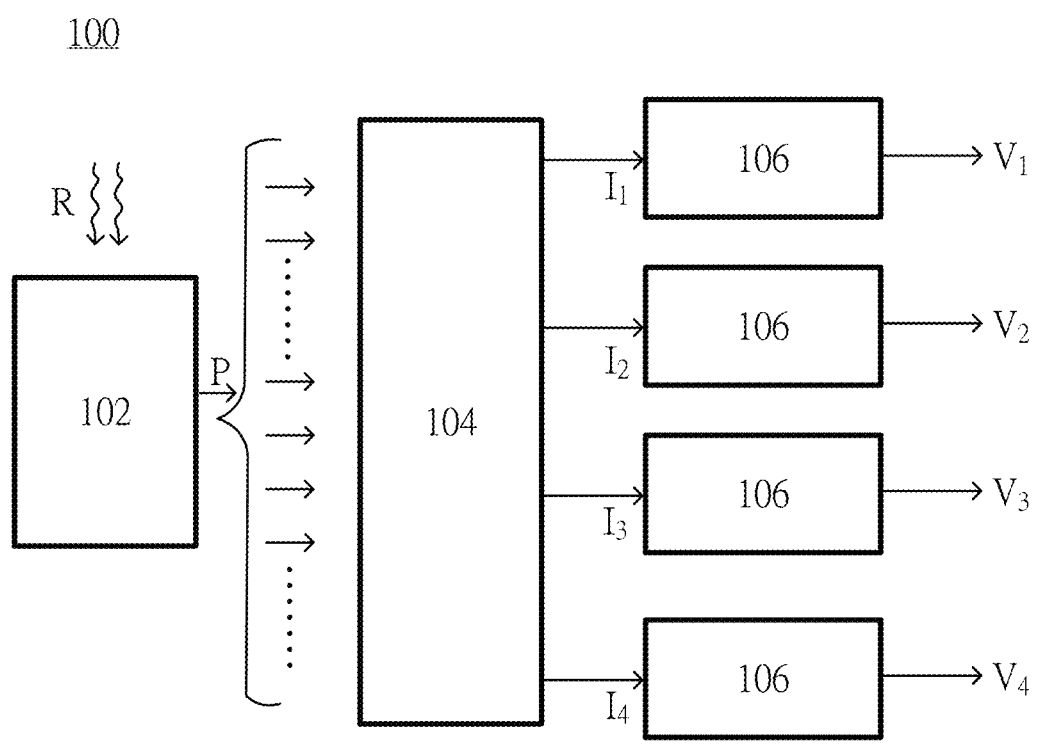
FIG. 1 illustrates the embodiment of conventional prompt gamma readout system.

As shown in FIG. 1, the system block diagram 100 for an embodiment of prompt gamma detection system of the present invention is illustrated. Please refer to FIG. 1, the charge division module 104 electrically connects the radiation detection module 102. The charge division module 104 receives the current pulse P, and converts it into the output first current $I_1$, second current $I_2$, third current $I_3$ and fourth current $I_4$, in order to electrically connects the transimpedance amplifier module 106. As shown in the Figure, there are four same transimpedance amplifier module 106, which connect the charge division module 104 through the first current $I_1$, the second current $I_2$, the third current $I_3$ and the fourth current $I_4$.

Please refer to the system block diagram 100 for an embodiment of prompt gamma detection system of the present invention illustrated in FIG. 1 again. In which, the transimpedance amplifier module 106 electrically connects the charge division module 104. The transimpedance amplifier module 106 receives the first current $I_1$, the second current $I_2$, the third current $I_3$ and the fourth current $I_4$, and outputs the first voltage $V_1$, the second voltage $V_2$, the third voltage $V_3$ and the fourth voltage $V_4$.

Still as shown in FIG. 1, the system block diagram 100 for an embodiment of gamma detection system of the present invention is illustrated. Through the transimpedance amplifier module 106 of the present invention, the output signal will not be distorted, that is the shape of output signal will not have big change. Thus, the transimpedance amplifier module 106 of the present invention needs not to use the adjustment circuit to further uses this output signal.

Continuing as shown in FIG. 1, the system block diagram 100 for an embodiment of gamma detection system of the present invention is illustrated. It has to describe that the radiation detection module 102 in this embodiment is the avalanche photodiode or photomultiplier. When the radiation detection module 102 is the photomultiplier, the radiation detection module will be the photomultiplier called Hamamatsu H8500.

Please refer to the system block diagram 100 for an embodiment of prompt gamma detection system of the present invention illustrated in FIG. 1 again. The prompt gamma detection system 100 inputs radiation R, wherein the bandwidth range for the electronic circuit of gamma detection system 106 is from 0 MHz to 200 MHz. In which, the total rms noise of the electronic circuit is 64.6 µV between 0 MHz to 200 MHz.

Figure 2:
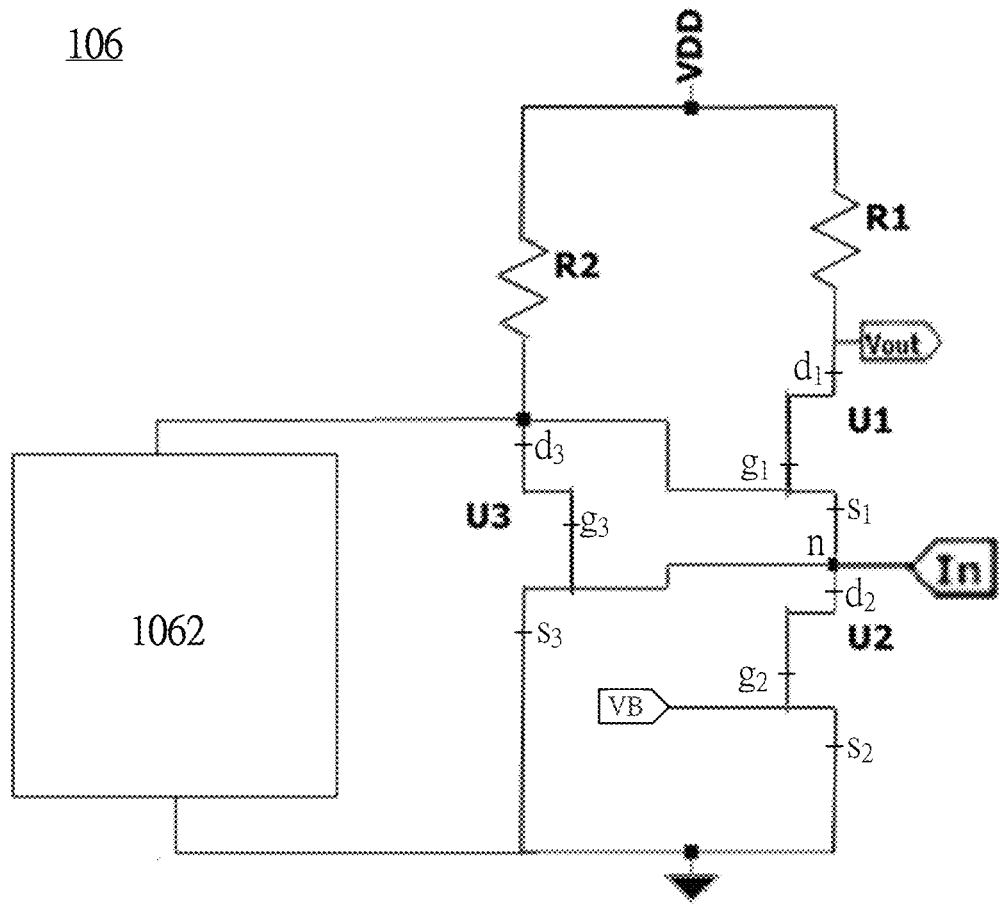
FIG. 2 illustrates the electronic circuit for an embodiment of transimpedance amplifier module of the present invention.

FIG. 2 illustrates the electronic circuit for an embodiment of gallium nitride transimpedance amplifier module 106 of the present invention. Please refer to FIG. 2 for the following description. The (gallium nitride) transimpedance amplifier module 106 of the present invention comprises a first transistor U1 (including drain electrode $d_1$, gate electrode $g_1$, and source electrode $s_1$), a second transistor U2 (including drain electrode $d_2$, gate electrode $g_2$, and source electrode $s_2$), a third transistor U3 (including drain electrode $d_3$, gate electrode $g_3$, and source electrode $s_3$), a first resistor R1, and a second resistor R2. In which, the first transistor U1, second transistor U2, and third transistor U3 comprise the gallium nitride high electron mobility transistor (HEMT), thus it is also called the gallium nitride amplifier circuit.

Please still refer to the electronic circuit for an embodiment of gallium nitride transimpedance amplifier module 106 of the present invention illustrated in FIG. 2. The first resistor R1 electrically connects the second resistor R2 and the drain electrode d1 of first transistor U1. The gate electrode $g_3$ of third transistor U3 electrically connects the source electrode $s_1$ of first transistor U1 and the drain electrode $d_2$ of second transistor U2. The second resistor R2 electrically connects the gate electrode $g_1$ of first transistor U1 and the drain electrode $d_3$ of third transistor U3.

Please refer to the electronic circuit for an embodiment of gallium nitride transimpedance amplifier module 106 of the present invention illustrated in FIG. 2 again. The input current $I_{in}$ flows through the source electrode $s_1$ of first transistor. The first transistor U1, the second transistor U2, and the first resistor R1 form a common gate amplifier. The input current Iin inputs from the input port In, in order to flow through the first transistor U1, wherein the input current Iin is the first current $I_1$, second current $I_2$, third current $I_3$ and fourth current $I_4$.

Please still refer to the electronic circuit for an embodiment of gallium nitride transimpedance amplifier module 106 of the present invention illustrated in FIG. 2. The second transistor U2 is biased in the saturation mode acts as a constant current source. The constant current source is used to bias first transistor U1 in saturation mode.

Still as shown in FIG. 2, the electronic circuit for an embodiment of gallium nitride transimpedance amplifier module 106 of the present invention is illustrated. The third transistor U3 and the second resistor R2 construct a common source amplifier in which, the gain peaking adjustment module 1062 is connected. The gain peaking adjustment module electrically connects the drain electrode and source electrode of third transistor. The gain peaking adjustment module 1062 is a capacitor, which keeps the gain fluctuation of the transimpedance amplifier 106 at the range of ±1 dB.

Please refer to the electronic circuit for an embodiment of gallium nitride transimpedance amplifier module 106 of the present invention illustrated in FIG. 2. In this embodiment, the first transistor U1, the second transistor U2 and the third transistor comprise the gallium nitride high electron mobility transistor (HEMT).

Still as shown in FIG. 2, the electronic circuit for an embodiment of gallium nitride transimpedance amplifier module 106 of the present invention is illustrated. The input port In is connected to the node n, which connects the drain electrode $d_2$ of second transistor U2, the source electrode $s_1$ of first transistor U1 and the gate electrode $g_3$ of third transistor U3. The current feeding through the input port, changes the potential on the node n, which influences the bias of first transistor U1, second transistor U2, and third transistor U3, and then influences the final output of electronic circuit. Finally, the amplified voltage from the output port $V_{out}$ will be the first voltage $V_1$, second voltage $V_2$, third voltage $V_3$ and fourth voltage $V_4$.

Figure 3A:
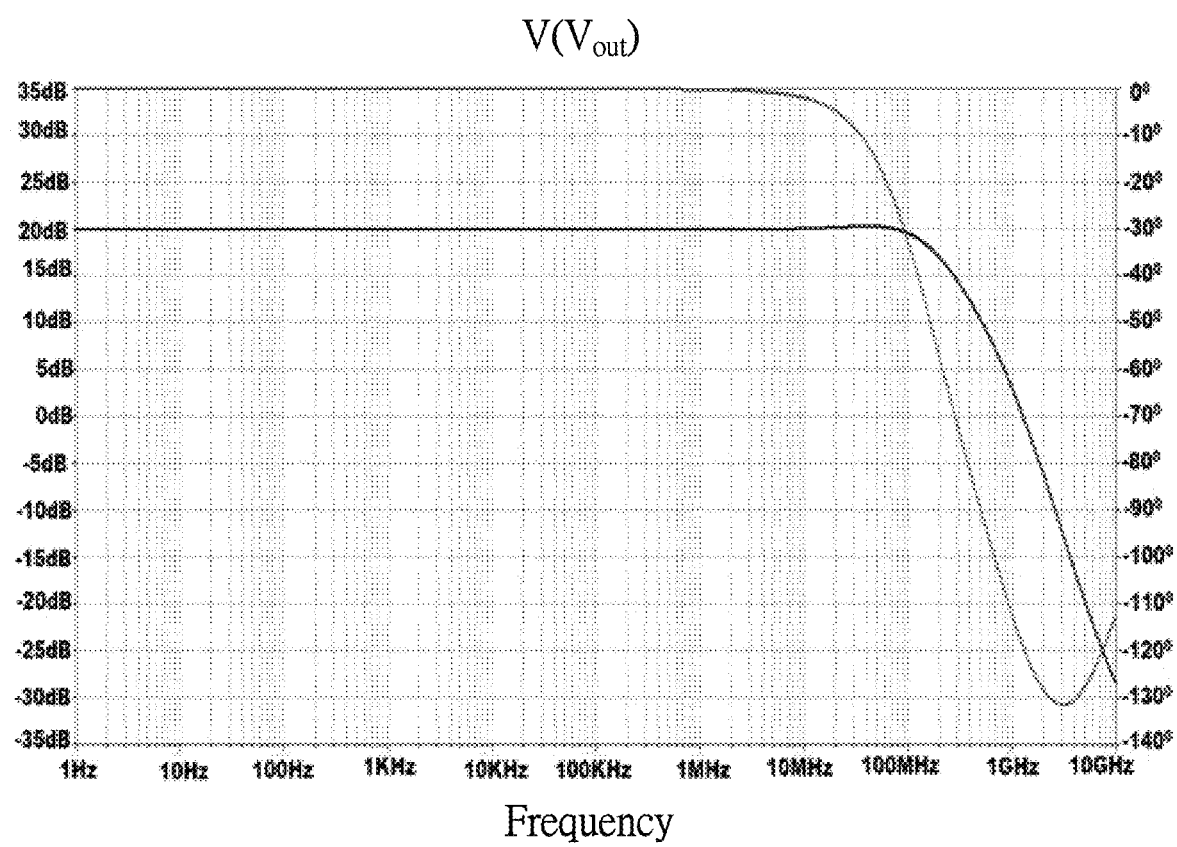
FIG. 3A illustrates the AC gain result for an embodiment of transimpedance amplifier module of the present invention.

Please refer to the AC gain result for an embodiment of transimpedance amplifier module of the present invention illustrated in FIG. 3A. As shown in FIG. 3A, the 3 dB frequency of the electronic circuit of the present invention is 200 MHz, and the gain is 20 dB.

Figure 3B:
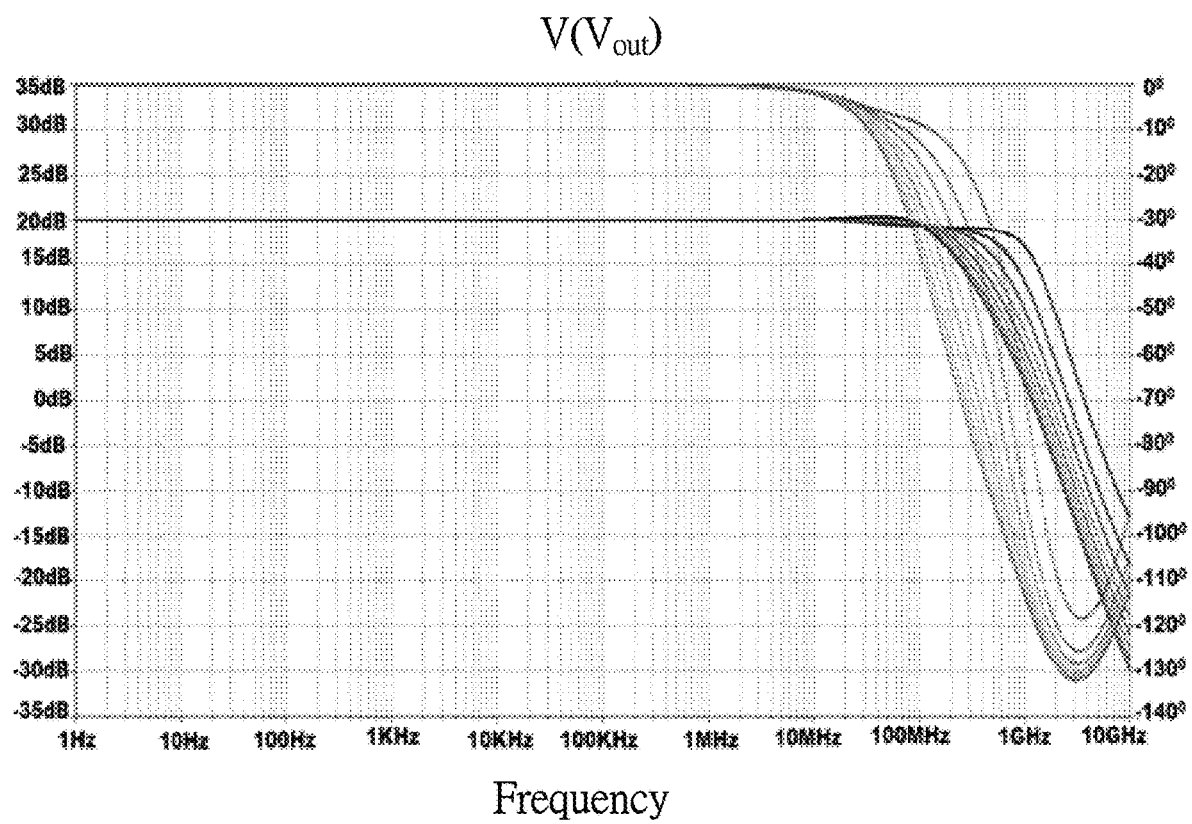
FIG. 3B illustrates the AC gain variation result for different input capacitances for an embodiment of transimpedance amplifier module of the present invention.

Please refer to the AC gain variation result for an embodiment of transimpedance amplifier module of the present invention illustrated in FIG. 3B. As shown in FIG. 3B, even the input capacitance is changed, the transimpedance amplifier module still can provide constant gain, and it means the present invention is not sensitive to the input capacitance variation.

Figure 3C:
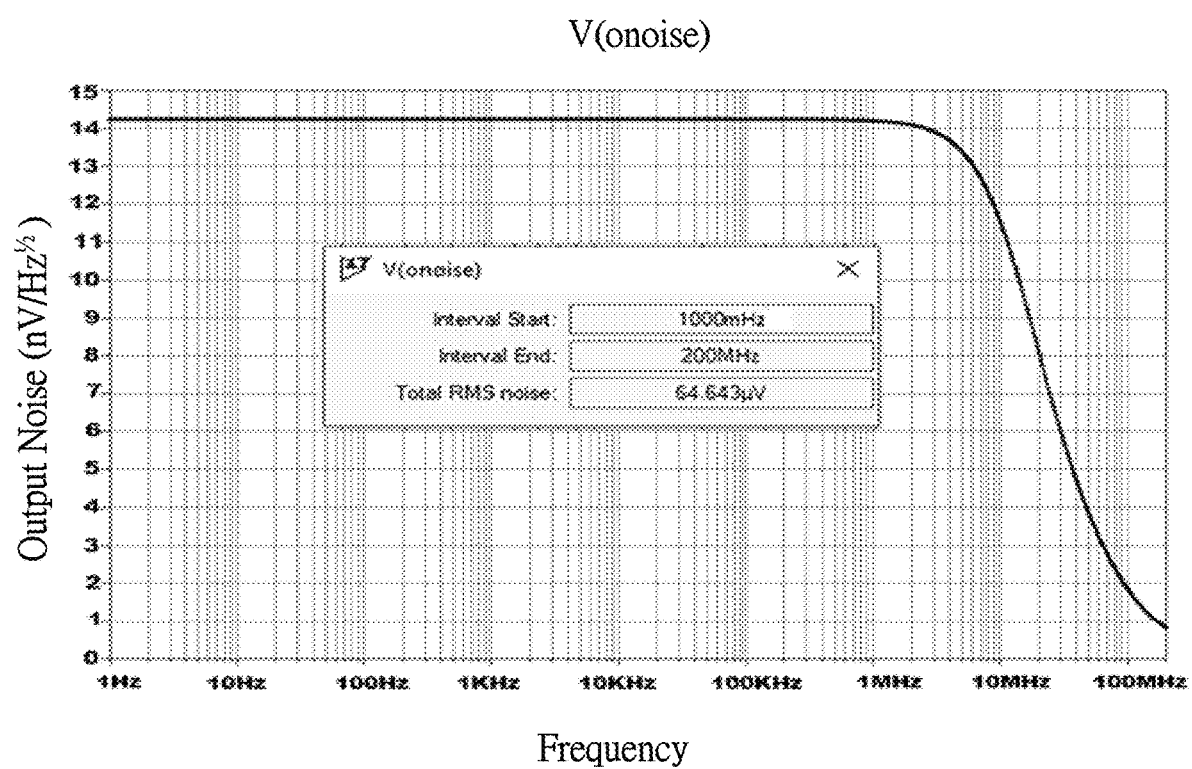
FIG. 3C illustrates the output noise for an embodiment of transimpedance amplifier module of the present invention.

Please refer to the output noise for an embodiment of transimpedance amplifier module of the present invention illustrated in FIG. 3C. As shown in FIG. 3C, the total rms noise of the present invention 64.6 µV in the 200 MHz of bandwidth.

Figure 3D:
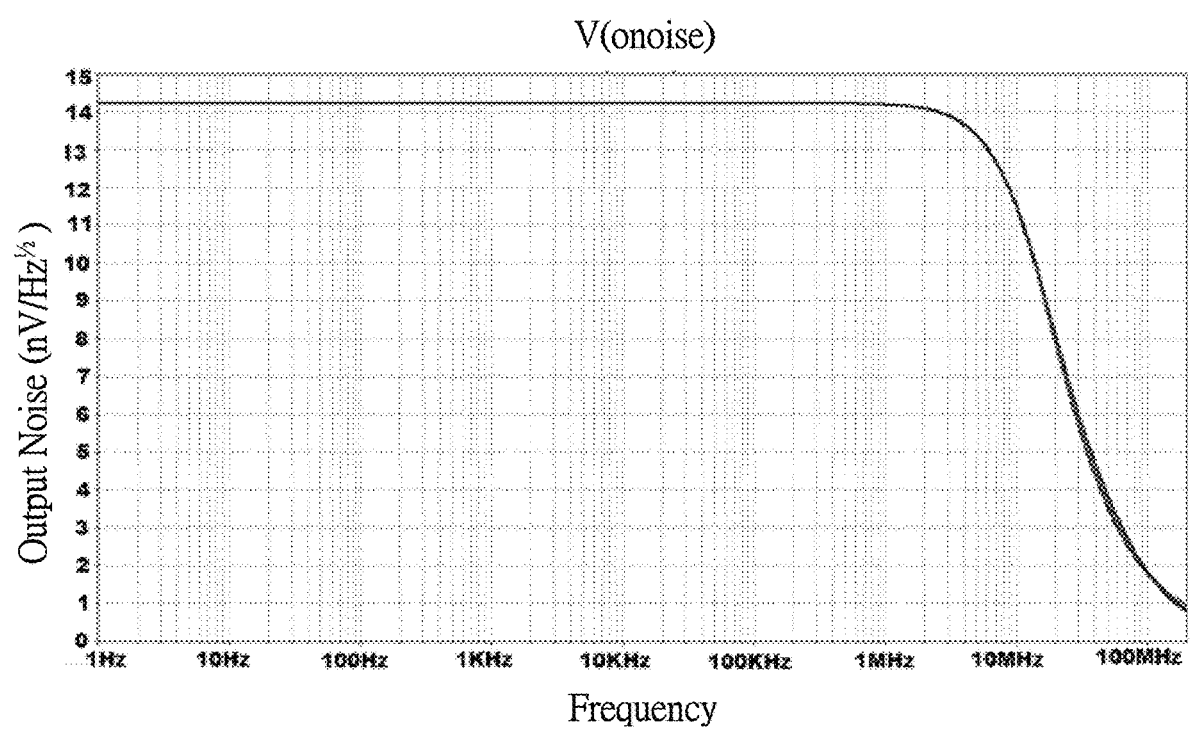
FIG. 3D illustrates the effect of input capacitance on the output noise for an embodiment of transimpedance amplifier module of the present invention.

Please refer to the capacitance noise variation for an embodiment of transimpedance amplifier module of the present invention illustrated in FIG. 3D. As shown in FIG. 3D, the output noise of the present invention is not sensitive to the input capacitance variation.

Compared with the silicon element, the present invention has the advantages of low noise and higher bandwidth. Conventionally, the transimpedance amplifier is designed using operational amplifier. The present invention uses the non-operational amplifier for the design and manufacturing, so it can widely raise the manufacturing yield and reduce the manufacturing cost. The present invention can be applied in the field of electronic circuit. The practical application is made by converting the current into voltage. The present invention can be widely used in the harsh environment, such as vehicle, train, aircraft, oil drilling platform, even in the severe radiation environment.

Compared with the silicon circuit, the electronic circuit design of the present invention is much simpler, which can obtain the same bandwidth with lower noise. In other words, compared with the conventional silicon circuit, the present invention can work under harsh condition with higher temperature, and still can provide higher bandwidth, high gain, and low noise.

Therefore, in order to increase the reliability of electronic element, the present invention uses the gallium nitride as the electronic circuit of transimpedance amplifier. Because the gallium nitride is more tolerant to the secondary radiation generated from the proton beam therapy, compared to the silicon devices, it has better radiation hardened effect, thus it can be used in the prompt gamma detection system used in proton beam therapy. It has high reliability and increases the reliability of the overall system.

It is understood that various modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to witch this invention pertains.

What is claimed is:

1. A gallium nitride amplifier circuit, wherein said gallium nitride amplifier circuit accepts a plurality of currents and outputs a plurality of voltages, and wherein said gallium nitride amplifier circuit comprises a first transistor, a second transistor, a third transistor, a first resistor and a second resistor, said first resistor electrically connecting said second resistor and a drain electrode of said first transistor, a gate electrode of said third transistor electrically connecting a source electrode of said first transistor and a drain electrode of said second transistor, said second resistor electrically connecting a gate electrode of said first transistor and a drain electrode of said third transistor, an input current flowing through a source electrode of said first transistor.

2. The gallium nitride amplifier circuit according to claim 1, wherein a bandwidth range of said gallium nitride amplifier circuit comprises 0 MHz to 200 MHz.

3. The gallium nitride amplifier circuit according to claim 2, wherein a noise generated in said electronic circuit comprises 64.6 µV within said bandwidth range.

4. The gallium nitride amplifier circuit according to claim 3, wherein said gallium nitride amplifier circuit further comprises a gain peaking adjustment module electrically connecting a drain electrode and a source electrode of said third transistor, and said gain peaking adjustment module comprises a capacitor, keeping a gain fluctuation of transimpedance amplifier in a range of ±1 dB.

5. The gallium nitride amplifier circuit according to claim 4, wherein said first transistor, said second transistor and said third transistor comprise gallium nitride high electron mobility transistors.

6. The gallium nitride amplifier circuit electrically connecting a charge division module, comprising:
   receiving a first current, a second current, a third current and a fourth current; and
   outputting a first voltage, a second voltage, a third voltage and a fourth voltage,
   wherein a bandwidth range of said gallium nitride amplifier circuit comprises 0 MHZ to 200 MHZ.

7. The gallium nitride amplifier circuit according to claim 6, wherein said noise generated in said electronic circuit comprises 64.6 µV within said bandwidth range.

8. The gallium nitride amplifier circuit according to claim 6, wherein said gallium nitride amplifier circuit comprises a first transistor, a second transistor, a third transistor, a first resistor and a second resistor, said first resistor electrically connecting said second resistor and a drain electrode of said first transistor, a gate electrode of said third transistor electrically connecting a source electrode of said first transistor and a drain electrode of said second transistor, said second resistor electrically connecting a gate electrode of said first transistor and a drain electrode of said third transistor, an input current flowing through a source electrode of said first transistor.

9. The gallium nitride amplifier circuit according to claim 8, wherein said gallium nitride amplifier circuit further comprises a gain peaking adjustment module electrically connecting a drain electrode and a source electrode of said third transistor, and said gain peaking adjustment module comprises a capacitor keeping a gain fluctuation of transimpedance amplifier in a range of ±1 dB.

10. The gallium nitride amplifier circuit according to claim 9, wherein said first transistor, said second transistor and said third transistor comprise gallium nitride high electron mobility transistors.

* * * * *